(12) United States Patent
Sommer

(10) Patent No.: US 7,635,886 B2
(45) Date of Patent: Dec. 22, 2009

(54) SEMICONDUCTOR MEMORY AND METHOD FOR FABRICATING THE SEMICONDUCTOR MEMORY

(75) Inventor: Michael Bernhard Sommer, Raubling (DE)

(73) Assignee: Qimonda AG, Munich (DE)

( * ) Notice: Subject to any disclaimer, the term of this patent is extended or adjusted under 35 U.S.C. 154(b) by 64 days.

(21) Appl. No.: 11/209,548

(22) Filed: Aug. 23, 2005

(65) Prior Publication Data
US 2006/0060906 A1 Mar. 23, 2006

(30) Foreign Application Priority Data
Aug. 23, 2004 (DE) .................. 10 2004 040 765

(51) Int. Cl.
*H01L 27/108* (2006.01)
(52) U.S. Cl. ........................ 257/296; 257/908
(58) Field of Classification Search ............. 257/296, 257/908
See application file for complete search history.

(56) References Cited

FOREIGN PATENT DOCUMENTS

| DE | 198 32 993 C1 | 11/1999 |
|---|---|---|
| DE | 101 04 716 A1 | 8/2002 |

*Primary Examiner*—Long Pham
(74) *Attorney, Agent, or Firm*—Eschweiler & Associates, LLC

(57) ABSTRACT

A semiconductor memory is disclosed having an electrically conductive region buried in a substrate, and having an array of first and second cells. The first cells are designed as memory cells each having a selection transistor and a storage capacitor and are connected to word lines and first bit lines. The second cells are designed as switchable contacts each having a selection transistor and a resistance element and are connected to a respective one of the word lines and to a second bit line. The resistance element includes a first electrode and a second electrode, which are conductively connected to one another. The second bit line makes it possible to apply a plate voltage to the buried conductive region in low-impedance fashion via the second cells.

13 Claims, 3 Drawing Sheets

SEMICONDUCTOR MEMORY AND METHOD FOR FABRICATING THE SEMICONDUCTOR MEMORY

REFERENCE TO RELATED APPLICATIONS

This application claims the benefit of the priority date of German application DE 10 2004 040 765.7, filed on Aug. 23, 2004, the contents of which are herein incorporated by reference in their entirety.

FIELD OF THE INVENTION

The invention relates to a semiconductor memory in which a buried electrically conductive region is connected to a predetermined voltage. The invention additionally relates to a method for fabricating the semiconductor memory.

BACKGROUND OF THE INVENTION

A semiconductor memory, for example a dynamic random access semiconductor memory, a so-called DRAM (dynamic random access memory) comprises, in particular, a semiconducting substrate, an array of memory cells, an address bus for application of a memory address, an address decoder for selection of one of the memory cells on the basis of the memory address and a data bus for reading or writing access to the information stored in the selected memory cell.

The array of memory cells is subdivided into rows and columns and comprises a plurality of word lines and a plurality of bit lines for reading and writing access to the memory cells. A respective one of the memory cells is connected to one of the word lines and to one of the bit lines. A respective one of the word lines is connected to the memory cells of one of the rows of the array. A respective one of the bit lines is connected to the memory cells of one of the columns of the array.

Each of the memory cells of the array contains a selection transistor having a control terminal and a controlled path and a storage capacitor having a first electrode and a second electrode. The second electrodes of the storage capacitors of the memory cells of the array are electrically conductively connected to one another.

The information stored in a selected memory cell is defined by the sign of a cell voltage. The cell voltage is a difference in the voltages between the first and second electrodes of the storage capacitor. The cell voltage has to be periodically refreshed, while retaining the sign to an initial value defined beforehand in order to counteract an exponential decrease over time that is brought about by leakage currents. The initial value and the decrease over time of the cell voltage determines a retention time within which the memory cell has to be refreshed again.

The semiconductor memory usually comprises a semiconducting substrate and the storage capacitor of one of the memory cells is formed as a trench capacitor in the semiconducting substrate. For this purpose, a trench is etched into the semiconducting substrate, the second electrode is formed as a highly doped electrode buried in the substrate and is arranged around the trench, a node dielectric is applied on that surface of the substrate which is located in the interior of the trench, and the first electrode is deposited as a highly doped trench electrode in the trench. Furthermore, the second electrodes of the memory cells are connected to one another by forming a highly doped region buried in the substrate. The highly doped region buried in the substrate is also referred to as a buried plate.

During the operation of the semiconductor memory, a constant predetermined voltage, the so-called plate voltage $V_{PL}$, is applied to the plate buried in the substrate. Supplying the buried plate with voltage necessitates a contact connection.

The buried plate is usually contact-connected via a highly doped contact well adjacent to the surface of the substrate. For its part, the contact well is connected to the plate voltage $V_{PL}$ via a highly doped lead, for instance made of polysilicon.

In general, the contact well extends between a part of the surface of the substrate that surrounds the array of memory cells and the buried plate. In this way, the contact well and the buried plate isolate an array well, in which the storage capacitors of the memory cells of the array are formed, from a peripheral well, in which the support circuits of the memory cell array are formed.

It is also possible for the array well to be surrounded by an isolation well and for the isolation well to be surrounded by the peripheral well. The isolation well then comprises both the buried plate and the contact well.

The buried plate and the contact well have a comparatively low specific conductivity. Furthermore, the trenches of the storage capacitors of the memory cells extend deep into the buried plate. As a result, the cross section of conductive material is reduced for a current flowing along the buried plate. Furthermore, the buried plate is contact-connected along the edge of the array of memory cells. As a result, the distance between the contact well and the second electrode of one of the memory cells is very large on average. Since the second electrode of one of the memory cells is on average connected to the plate voltage $V_{PL}$ with very high impedance, the time constant for changes in the potential at the location of the second electrode is large and the value of the potential is poorly controllable. In particular, the initial value of the cell voltage that is produced during the refresh of one of the memory cells may be too small. The resultant shortening of the retention time may lead to a loss of the stored information.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

General Description of the Invention

The invention is directed to specify a semiconductor memory which enables an improved control of the electrical potential of the buried plate.

According to one embodiment of the invention, a semiconductor memory comprises a semiconducting substrate with an electrically conductive region buried in the substrate, word lines, first bit lines and a second bit line and also first and second cells. A respective one of the first and second cells has a control terminal connected to one of the word lines, a first terminal and a second terminal connected to the electrically conductive region, and contains a selection transistor with a path controlled via the control terminal. A respective one of the first cells is connected to one of the first bit lines via the first terminal and contains a series circuit comprising the controlled path of the transistor and a storage capacitor, wherein the series circuit is arranged between the first terminal and the second terminal of the one of the first cells. A respective one of the second cells is connected to the second bit line via the first terminal and contains a series circuit comprising the controlled path of the transistor and a resistance element, wherein the series circuit is arranged between the first terminal and the second terminal of the one of the second cells.

The first cells of the array are provided for storing information. The second cells of the array serve as switchable contacts via which a plate voltage $V_{PL}$, within the array of cells, can be applied with low impedance to different points of the buried electrically conductive region. As a result, the potential of the buried electrically conductive region can be defined better at the location of an adjacent one of the first cells. Accordingly, the cell voltage in the adjacent one of the first cells is refreshed to a more precisely defined initial value and the retention time of the adjacent one of the first cells is determined more precisely.

One of the second cells and a plurality of the first cells are connected, in one example, to the same one of the word lines.

The electrically conductive region comprises, in one example, a highly doped n-conducting region.

The second bit line and the first bit lines run parallel to one another in one example, and the second bit line is arranged centrally with respect to the first bit lines. The second bit line in such example divides the array of first and second cells into partial arrays in which the same number of first bit lines run in each case.

A respective one of the second cells comprises, in one example, a deep trench formed in the substrate, and the resistance element of the one of the second cells comprises a first electrode arranged in the trench and a second electrode surrounding the trench.

A dielectric layer with an opening is formed between the first electrode and the second electrode of the resistance element of the one of the second cells, in one example, and the first electrode and the second electrode are conductively connected to one another in the opening.

The first electrode of the resistance element of the one of the second cells contains n-doped polysilicon, in one example, and the second electrode is a highly doped n-conducting plate buried in the substrate in such example.

In one example, the first and the second electrode of the resistance element of the one of the second cells are directly adjacent to one another.

In one example the second bit line is connected to a voltage generator for a plate voltage $V_{PL}$.

In another example the plate voltage $V_{PL}$ is connected to the electrically conductive region via the conductive path of the selection transistor.

The semiconductor memory may additionally comprise sense amplifiers, a respective one of the first bit lines being connected to one of the sense amplifiers.

In such an example one of the sense amplifiers is connected to a voltage generator for a high bit line voltage $V_{BLH}$ and the plate voltage $V_{PL}$ essentially corresponds to half the high bit line voltage $V_{BLH}$.

The semiconductor memory may additionally comprise a terminal for application of a destruction voltage $V_{DEL}$ to the second bit line.

In accordance with another embodiment of the invention a method for fabricating a semiconductor memory in which a low-impedance contact to the buried plate is provided.

The method according to one embodiment of the invention for fabricating a semiconductor memory comprises providing a substrate and forming first and second cells each having a first electrode and a second electrode. In this case, forming the first and second cells comprises forming deep trenches extending into the depth of the electrically conductive region in the substrate, forming the first electrodes of the first and second cells in the trenches, and forming the second electrodes of the first and second cells around the trenches.

The method according to the invention for fabricating a semiconductor memory furthermore comprises producing electrically conductive connections in the second cells, which includes producing a respective one of the electrically conductive connections between the first electrode and the second electrode in one of the second cells, and forming word lines, first bit lines and a second bit line on the substrate, and connecting a respective one of the first cells to one of the first bit lines and a respective one of the second cells to the second bit line.

The method for fabricating a semiconductor memory comprises, in one example, forming a dielectric layer between the first electrode and the second electrode of a respective one of the second cells. In this example, producing the electrically conductive connections in the second cells is performed last and comprises destroying the dielectric layer in a respective one of the second cells, which includes applying a switch-on voltage $V_{PP}$ to that one of the word lines which is connected to the one of the second cells, and applying a destruction voltage $V_{DEL}$ to the second bit line, and also repeating destroying the dielectric layer in a respective one of the second cells for further second cells connected to the second bit line.

The application of the destruction voltage $V_{DEL}$ may additionally comprise generating the destruction voltage $V_{DEL}$ in an external test device and applying the destruction voltage $V_{DEL}$ to the second bit line via a terminal for the external test device.

The method for fabricating a semiconductor memory may further comprise applying a fixed plate voltage $V_{PL}$ to the second bit line.

Forming the first and second cells comprises, in one example, producing electrically conductive connections in the second cells. In this example, producing electrically conductive connections in the second cells comprises covering the deeper trenches of the second cells and forming a dielectric in the non-covered trenches.

Forming the first and second cells comprises, in one example, forming the second cells, which includes producing a trench capacitor with a dielectric layer. In this case, fabricating the semiconductor memory additionally comprises applying a destruction voltage $V_{DEL}$ to the second bit line for the purpose of destroying the dielectric layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
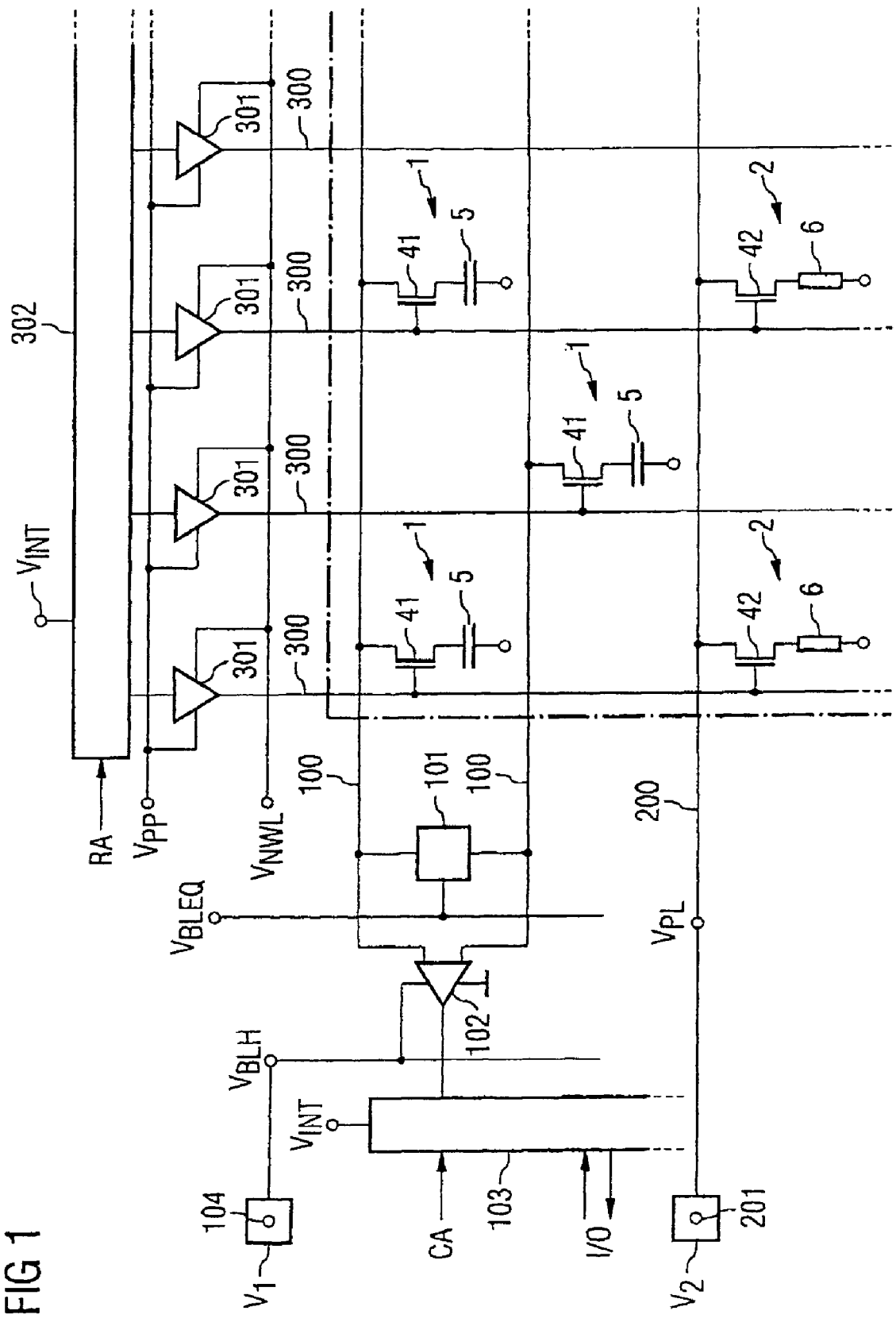
FIG. 1 is a schematic diagram illustrating a dynamic random access semiconductor memory (DRAM) in accordance with one embodiment of the present invention.

A dynamic random access semiconductor memory illustrated in FIG. 1 comprises a semiconducting substrate, an array of cells containing first cells 1 and second cells 2, an address bus for application of a memory address RA and CA, an address decoder 302 and 103 for selection of one of the first cells 1 on the basis of the memory address, and a data bus for reading or writing access I/O to the information stored in the one of the first cells 1.

The semiconductor memory furthermore comprises a plurality of word lines 300, a plurality of first bit lines 100 and a second bit line 200. The cells 1 and 2 of the array are arranged in rows and columns, one of the rows of the array containing a plurality of the first cells 1 and one of the second cells 2 and one of the columns of the array containing only first cells 1 or only second cells 2. A respective one of the first cells 1 is connected to one of the word lines 300 and to one of the first bit lines 100. A respective one of the second cells 2 is connected to one of the word lines 300 and to the second bit line 200. One of the word lines is connected in each case to the cells 1 and 2 of a row of the array. One of the first bit lines 100 is connected in each case to the first cells 1 of a column of the array. The second bit line 200 is connected to the second cells 2 of a column of the array.

The address decoder 302 and 103 comprises a word line decoder 302 and a bit line decoder 103. A respective one of the word lines 300 is connected to the word line decoder 302 via a word line driver 301. Two of the first bit lines 100 are in each case connected by an equalized circuit 101 and are connected to the bit line decoder 103 via a sense amplifier 102.

Each of the cells 1 and 2 of the array respectively has a control terminal, a first terminal, and a second terminal, and contains a selection transistor 41 and 42 with a control electrode connected to the control terminal, and comprises a controlled path. Each of the first cells 1 contains a storage capacitor 5 having a first electrode and a second electrode, a series circuit comprising the controlled path of the selection transistor 41 and the storage capacitor 5 being arranged between the first terminal and the second terminal. Each of the second cells 2 contains a resistance element 6 having a first electrode and a second electrode, a series circuit comprising the controlled path of the selection transistor 42 and the resistance element 6 being arranged between the first terminal and the second terminal.

The control terminal of one of the first cells 1 (the gate of the select transistor 41) is connected to one of the word lines 300. The first electrode of the storage capacitor 5 of the one of the first cells 1 is connected to one of the bit lines 100 via the controlled path of the selection transistor 41. The second electrode of the storage capacitor 5 of the one of the first cells 1 is connected to a doped plate 3 (see FIG. 2) that is buried in the substrate and is common to the entire array of cells 1 and 2.

Figure 2:
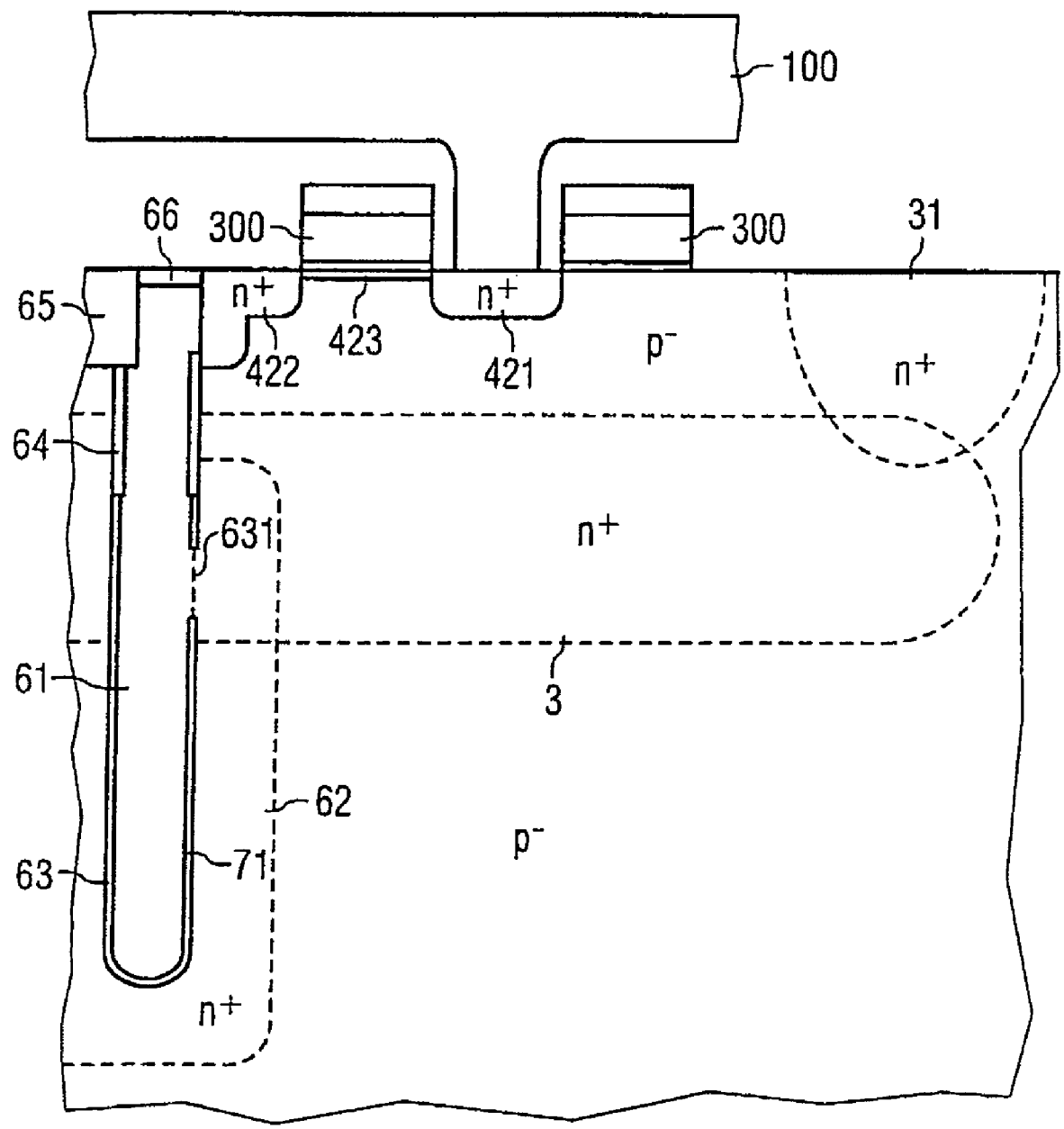
FIG. 2 is a fragmentary cross section diagram illustrating one of the second cells 2 of the semiconductor memory in accordance with an embodiment of the present invention.

The control terminal of one of the second cells 2 (the gate terminal of the select transistor 42) is connected to one of the word lines 300. The first electrode of the resistance element 6 of the one of the second cells 2 is connected to the second bit line 200 via the controlled path of the selection transistor 42. The second electrode of the resistance element 6 of the one of the second cells 2 is connected to the doped plate 3 that is buried in the substrate and is common to the entire array of cells 1 and 2, as illustrated in FIG. 2.

The semiconductor memory employs, for operation in one example, a plurality of internal voltage levels which are generally generated from a single, positive, external supply voltage $V_{DD}$ and in each case have a temporally constant value that is predetermined and is positive or negative with respect to a reference potential $V_{SS}$. In particular, a stabilized internal supply voltage $V_{INT}$ is generated, from which a substrate bias voltage $V_{BB}$, a switch-on voltage $V_{PP}$, a switch-off voltage $V_{NWL}$, a high bit line voltage $V_{BLH}$, an equalized voltage $V_{BLEQ}$ and a plate voltage $V_{PL}$ are then derived. By using charge pumps, it is also possible to generate internal voltage levels which lie outside the level range delimited by $V_{SS}$ and $V_{DD}$. By way of example, from an external supply voltage $V_{DD}$ of 3.3 V there is generated an internal supply voltage $V_{INT}$ of 2.5 V and from the latter are generated a substrate bias voltage $V_{BB}$ of −1.3 V, a switch-on voltage $V_{PP}$ of 3.5 V, a switch-off voltage $V_{NWL}$ of −0.5 V, a high bit line voltage $V_{BLH}$ of 1.8 V, an equalized voltage $V_{BLEQ}$ and a plate voltage $V_{PL}$ of 0.9 V in each case.

The word line driver 301 of a respective one of the word lines 300 is connected to the switch-off voltage $V_{NWL}$ and to the switch-on voltage $V_{PP}$. The equalized circuit 101 is connected to the equalized voltage $V_{BLEQ}$. The sense amplifier 102 of in each case two of the first bit lines 100 is connected to the high bit line voltage $V_{BLH}$ and to the reference voltage $V_{SS}$. The semiconducting substrate 7 is connected to the substrate bias voltage $V_{BB}$.

The second bit line 200 is connected to the plate voltage $V_{PL}$. The conductive plate 3 may also additionally be connected to the plate voltage $V_{PL}$ via a contact well 31.

The operation of the semiconductor memory is described preceding from an initial state in which the switch-off voltage $V_{NWL}$ is applied to each of the word lines 300 via the respective word line driver 301 and the equalized voltage $V_{BLEQ}$ is applied to each of the first bit lines 100 via the respective equalized circuit 101. In this state, in each of the first cells 1, the controlled path of the selection transistor 41 is turned off and the cell voltage between the first electrode and the second electrode of the storage capacitor decreases over time on account of leakage currents.

Firstly, the first bit lines 100 are disconnected from the equalized voltage $V_{BLEQ}$ through application of a clock signal to the equalized circuit 101. The voltages of the first bit lines 100 are now equalized and decreased over time on account of leakage currents. Through application of a memory address RA and CA to the address bus and application of a clock signal to the word line decoder 302, the switch-on voltage $V_{PP}$ is then applied to one of the word lines 300 via the respective word line driver 301. As a result, the controlled path of the appropriate selection transistor 41 in each case of the first cells 1 of one of the rows of the array is turned on. In addition, the controlled path of the appropriate selection transistor 42 of the second cell 2 of the one of the rows of the array is turned on. If the controlled path of the selection transistor 41 of one of the first cells 1 is turned on, the voltage of the first electrode of the storage capacitor 5 and the voltage of that one of the first bit lines 100 connected to the one of the first cells 1 are equalized. If the controlled path of the selection transistor 42 of one of the second cells is turned on, the plate voltage $V_{PL}$ is applied to the conductive plate 3 via the second bit line 200 and the conductive connection between the first electrode and the second electrode of the resistance element 6.

Through the application of the switch-on voltage $V_{PP}$ to one of the word lines 300, therefore, those bit lines from among the first bit lines 100 are selected which are connected to the first cells 1 of the corresponding row of the array. The voltages of the selected bit lines from among the first bit lines 100 are either increased or reduced in comparison with the voltages of the rest of the first bit lines 100 depending on the sign of the cell voltage, that is to say the sign of the difference between the voltage of the first electrode and the voltage of the second electrode of the storage capacitor 5. In addition, in one of the second cells in each case, the first electrode of the resistance element 6 is connected to the plate voltage $V_{PL}$ via the controlled path of the selection transistor 42. As a result, the plate voltage $V_{PL}$ is applied to the doped plate 3 buried in the substrate via the second electrode of the resistance element 6.

Local changes—brought about by the switching-on of one of the words lines 300—in the potential of the high-impedance conductive plate 3 buried in the substrate can be significantly reduced by the average distance between one of the first cells 1 and the nearest of the second cells 2 being kept as small as possible. This is achieved for example by forming the second bit line 200 and the first bit lines 100 such that they run parallel to one another and by arranging the second bit line 200 centrally between the first bit lines 100.

In the case of larger memory arrays, it is possible to provide a plurality of second bit lines 200. In this case, a previously defined number of the first bit lines 100 are preferably arranged between in each case two of the second bit lines 200. Thus, by way of example, 6 second bit lines 200 may be provided. In this case, approximately 50 of the first bit lines 100 in each case are then arranged in the 5 regions between in each case two of the second bit lines 200.

Figure 3:
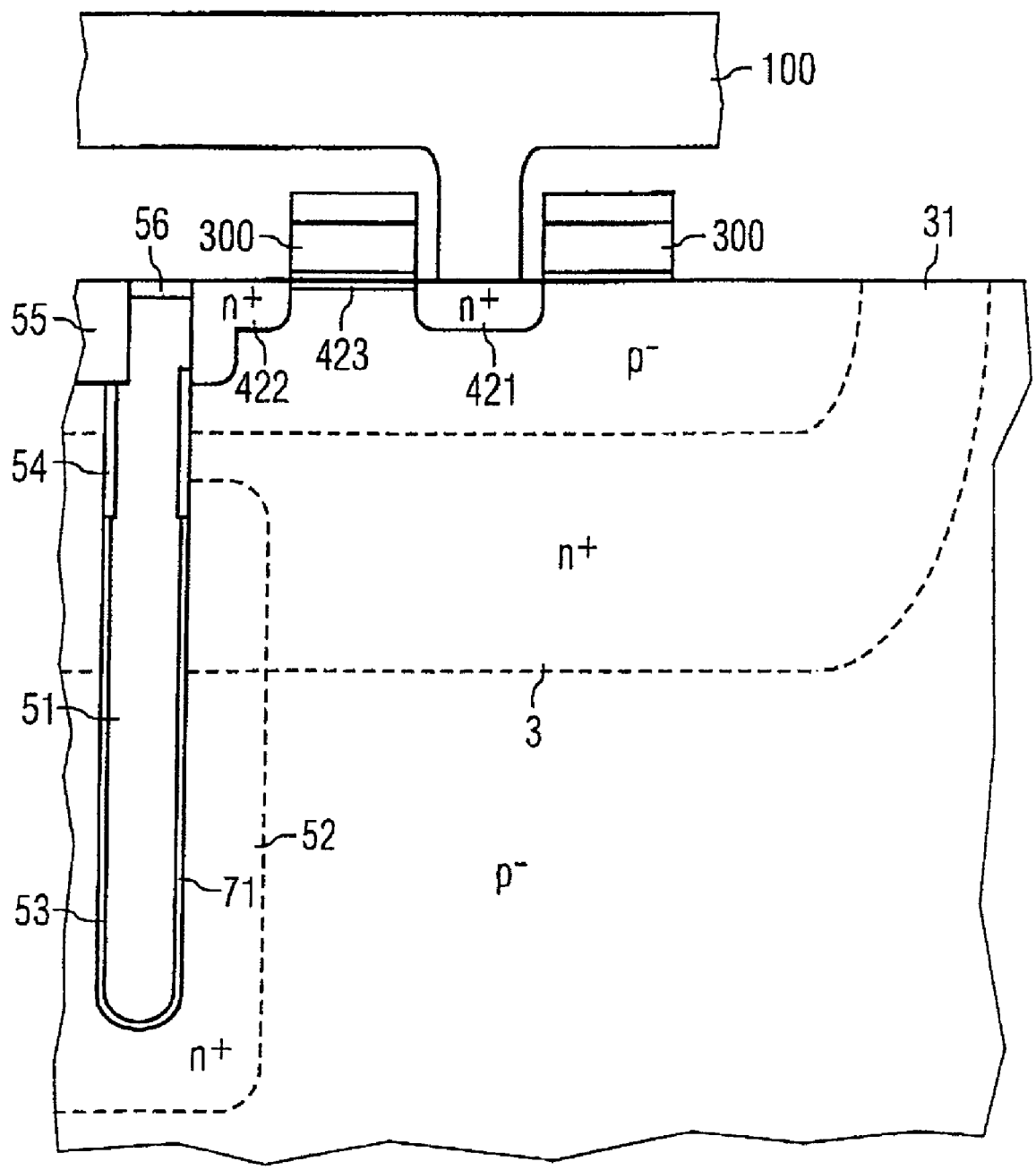
FIG. 3 is a fragmentary cross section diagram illustrating one of the first cells of a semiconductor memory.

The edge of the array of the first and second cells 1 and 2 is illustrated in accordance with one embodiment of the invention in FIGS. 2 and 3. FIG. 2 shows one of the second cells 2. FIG. 3 shows one of the first cells 1, which corresponds to one of the memory cells employed to hold data.

In order to fabricate the arrangement illustrated, a p-conducting substrate comprising silicon, for example, is provided. An array region and a peripheral region, each comprising a section of the substrate 7, are defined by means of corresponding masks. An array of first and second cells 1 and 2 is formed in the section of the substrate 7 of the array region. Support circuits are formed in the section of the substrate 7 of the peripheral region.

The array of first and second cells 1 and 2 is formed by forming a buried conductive region 3, the storage capacitors 5, the resistance element 6, the selection transistors 41 and 42, the word lines 300, the first bit lines 100 and the second bit line 200. The buried n-conducting region 3 is formed for example by implanting ions of phosphorus and arsenic into the substrate 7. The storage capacitors 5 and resistance elements 6 are formed by etching trenches into the substrate 7, which trenches extend right into the depth of the buried conductive region 3, and by forming either one of the storage capacitors 5 or one of the resistor elements 6 in a respective one of the trenches. The selection transistors 41 and 42 are formed by forming gate stacks on the substrate 7 and source regions 421, drain regions 422 and source-drain channel regions 423 in the substrate 7.

The gate stacks are formed for example by successively applying layers made of silicon dioxide, n-conducting polysilicon and silicon nitride and photolithographically patterning the applied layers. The source regions 421, drain regions 422 and source-drain channel regions 423 are produced for example by implanting ions of phosphorus or arsenic. In this case, the implantation of the ions for the source regions 421 and the drain regions 422 may be effected in a self-aligned manner with respect to the gate stacks. The word lines 300 are formed for example by applying layers made of silicon dioxide and n-conducting polysilicon on the substrate 7 and patterning them photolithographically. As a result, the word lines 300 and the gate stacks may be formed concurrently. The first bit line 100 and the second bit line 200 are formed by firstly applying and planarizing a dielectric layer above the substrate 7 and the gate stacks and word lines 300 formed thereon, then forming openings for bit line contacts in the dielectric layer, and finally depositing a layer made, for example, of aluminum or copper on the dielectric layer and in the openings and patterning it photolithographically.

The first cells 1 and the second cells 2 of the array differ in that one of the first cells 1 contains in each case one of the storage capacitors 5 and one of the second cells 2 contains in each case one of the resistance elements 6. The storage capacitors 5 and the resistance elements 6 respectively comprise a first electrode 51 and 61 and a second electrode 52 and 62 and are formed by firstly forming the second electrode 52 and 62 and then forming the first electrode 51 and 61. The second electrode 52 and 62 is formed for example by firstly applying a doping layer to a surface of the substrate 7 that is located in the one of the trenches, then increasing the temperature in order to effect a diffusion of a dopant from the doping layer into a section of the substrate 7 that is adjacent to the surface, and then removing the doping layer again. The first electrode 51 and 61 is formed for example by depositing polysilicon in the one of the trenches and making it n-conducting by the implantation of ions.

One of the storage capacitors 5 can be formed in one of the trenches 71 by arranging a node dielectric 53 between the first electrode 51 and the second electrode 52. For this purpose, by way of example, an oxide-nitride-oxide layer is applied to the surface of the substrate 7 that is located in the one of the trenches 71 before the first electrode 51 is formed in the one of the trenches 71. In this way the node dielectric 53 is arranged between the first electrode 51 and the second electrode 52.

One of the resistance elements 6 can be formed in one of the trenches 71 by producing a conductive connection between the first electrode 61 and the second electrode 62. For this purpose, by way of example, firstly the second electrode 62 is formed around the one of the trenches 71, then the one of the trenches 71 is covered or filled, and then the first electrode 62 is formed in the one of the trenches 71.

It is also possible firstly to form a provisional storage capacitor having a first electrode, a second electrode and a node dielectric in the one of the trenches 71. One of the resistance elements 6 having a first electrode 61 and a second electrode 62 may then be produced from the provisional storage capacitor by electrically destroying the node dielectric of the provisional storage capacitor. The node dielectric of the provisional storage capacitor can be electrically destroyed by generating a destruction voltage $V_{DEL}$ between the first electrode and the second electrode of the provisional storage capacitor. The resistance element 6 produced from the provisional storage capacitor then contains, besides a first electrode 61 and a second electrode 62, also a dielectric layer 63 arranged between the first electrode 61 and the second electrode 62 and having an opening 64 in which the first electrode 61 and the second electrode 62 are conductively connected to one another.

Since the resistance elements 6 are formed only in the second cells 2, the provisional storage capacitor is formed from one of the second cells. Since one of the second cells 2 is connected in each case by the control terminal to one of the word lines 300, by the first terminal to the second bit line 200 and by the second terminal to the doped plate 3 buried in the substrate, it is possible to generate the destruction voltage $V_{DEL}$ between the first electrode and the second electrode of the provisional storage capacitor by applying a first voltage $V_1$ referred to ground to the doped plate 3 buried in the substrate, a second voltage $V_2$ referred to ground to the second bit line 200, and the switch-on voltage $V_{PP}$ to one of the word lines 300 which are connected to the one of the second cells 2. In order in this case not to destroy the node dielectric 53 of the storage capacitor 5 of one of the first cells 1 which are likewise connected to the one of the word lines 300, the first voltage $V_1$ is additionally applied to one of the first bit lines 100 which are connected to the one of the first cells 1.

Preferably, in the second cells 2 which are connected to the second bit line 200, one of the resistance elements 6 is produced successively in each case from a provisional storage capacitor. In this case, one of the resistance elements 6 is produced in a respective one of the second cells 2 by applying the switch-on voltage $V_{PP}$ to one of the word lines 300 and by additionally applying the first voltage $V_1$ to the first bit lines 100 and the voltage $V_2$ to the second bit line 200. Then this is because the difference between the voltage $V_1$ applied to the first bit lines 100 and the voltage $V_2$ applied to the second bit line 200 drops across a series circuit of a first and a second capacitance, the first capacitance being effected by the parallel circuit of the storage capacitors 5 of the first cells 1 which are connected to the one of the word lines, and the second capacitance being effected by the provisional storage capacitor of the one of the second cells.

If respective cells from among the second cells 2 which are connected to the second bit line 200 already contain a resistance element 6, then the switch-off voltage $V_{NWL}$ must be applied to the corresponding word lines from among the word lines 300 in order to generate a destruction voltage $V_{DEL}$ between the doped plate 3 buried in the substrate and the second bit line 200.

The voltages $V_1$ and $V_2$ may be applied to the first bit lines 100 and to the second bit line 200 for example after the fabrication of the semiconductor memory by means of an external test device via terminals for test voltages 104 and 201, as illustrated in FIG. 1. By way of example, a logic value that effects a positive cell voltage may in each case be written to the first cells 1 for programming purposes. As a result, the first electrode 51 of the storage capacitor 51 of a respective one of the first cells 1 has the high bit line voltage $V_{BLH}$ applied to it each time when the cell voltage is refreshed. Then the high voltage of the bit line $V_{BLH}$ can be set to the value of the voltage $V_1$ via the terminal 104 and the plate voltage $V_{PL}$ can be set to the value of the voltage $V_2$ via the terminal 201. The switch-on voltage $V_{PP}$ is then applied successively to a respective one of the words lines 300 in order to destroy the node dielectric of the provisional storage capacitor in each case in one of the second cells 2.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A semiconductor memory, comprising:
    a semiconducting substrate comprising an electrically conductive region buried in the substrate;
    word lines, first bit lines, and a second bit line;
    first cells and second cells;
    each first cell comprising a control terminal connected to one of the word lines, a first terminal, and a second terminal connected to the electrically conductive region, and a selection transistor with a path controlled via the control terminal;
    a respective one of the first cells connected to one of the first bit lines via its first terminal thereof, and comprising a series circuit comprising the controlled path of the selection transistor and a storage capacitor, wherein the series circuit is arranged between its first terminal and its second terminal thereof;
    each second cell comprising a control terminal connected to one of the word lines, a first terminal, and a second terminal connected to the electrically conductive region, and a selection transistor with a path controlled via the control terminal;
    a respective one of the second cells connected to the second bit line via its first terminal thereof, and comprising a series circuit comprising the controlled path of the selection transistor and a resistance element, wherein the series circuit is arranged between its first terminal and its second terminal thereof.

2. The semiconductor memory of claim 1, wherein one of the second cells and a plurality of the first cells are connected to a common one of the word lines.

3. The semiconductor memory of claim 1, wherein the electrically conductive region comprises a highly doped n-conducting region.

4. The semiconductor memory of claim 1, wherein the second bit line and the first bit lines run parallel to one another and wherein the second bit line is arranged centrally with respect to two of the first bit lines.

5. The semiconductor memory of claim 1, wherein one of the second cells comprises a deep trench formed in the substrate, and wherein the resistance element of the one of the second cells comprises a first electrode arranged in the trench and a second electrode surrounding the trench.

6. The semiconductor memory of claim 5, wherein the resistance element further comprises a dielectric layer lining the trench and comprising an opening therein formed between the first electrode and the second electrode, wherein the first electrode and the second electrode are conductively connected to one another in the opening.

7. The semiconductor memory of claim 5, wherein the first electrode of the resistance element of the one of the second cells comprises n-doped polysilicon, and the second electrode comprises a highly doped n-conducting plate buried in the substrate.

8. The semiconductor memory of claim 5, wherein the first and the second electrode of the resistance element of the one of the second cells are directly adjacent to one another.

9. The semiconductor memory of claim 1, wherein the second bit line is connected to a voltage generator for a plate voltage.

10. The semiconductor memory of claim 9, wherein the voltage generator for the plate voltage is connected to the electrically conductive region via the conductive path of the selection transistor of the second cell.

11. The semiconductor memory of claim 1, further comprising sense amplifiers, each respectively coupled to one of the first bit lines.

12. The semiconductor memory of claim 11, wherein each sense amplifier is connected to a voltage generator for a high bit line voltage and a plate voltage associated with the second bit line corresponds to half the high bit line voltage.

13. The semiconductor memory of claim 1, further comprising a terminal for application of a destruction voltage to the second bit line.

* * * * *